(12) United States Patent  
Kim et al.

(10) Patent No.: US 12,416,690 B2
(45) Date of Patent: Sep. 16, 2025

(54) MAGNETIC SENSOR USING METAL AND SILICON JUNCTION STRUCTURE

(71) Applicant: KOREA ADVANCED INSTITUTE OF SCIENCE AND TECHNOLOGY, Daejeon (KR)

(72) Inventors: Kab-Jin Kim, Daejeon (KR); Jun-Ho Kang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 130 days.

(21) Appl. No.: 18/149,232

(22) Filed: Jan. 3, 2023

(65) Prior Publication Data

US 2023/0221386 A1 Jul. 13, 2023

(30) Foreign Application Priority Data

Jan. 7, 2022 (KR) .................. 10-2022-0002748

(51) Int. Cl.
*G01R 33/07* (2006.01)
*G01R 33/02* (2006.01)

(52) U.S. Cl.
CPC ......... *G01R 33/07* (2013.01); *G01R 33/0206* (2013.01)

(58) Field of Classification Search
CPC ..................... G01R 33/07; G01R 33/0206
See application file for complete search history.

(56) References Cited

U.S. PATENT DOCUMENTS

| 2004/0129934 A1* | 7/2004 | Takatsuka ............ H10N 52/101 257/40 |
| 2007/0096228 A1 | 5/2007 | Ahn et al. |
| 2008/0151615 A1 | 6/2008 | Rodmacq et al. |
| 2011/0234218 A1 | 9/2011 | Lagouge |
| 2014/0347045 A1 | 11/2014 | Paul et al. |

FOREIGN PATENT DOCUMENTS

| CN | 205376584 U | * 7/2016 |
| JP | 2010-266247 | 11/2010 |
| JP | 2010266247 A | * 11/2010 |
| KR | 10-2017-0097828 | 8/2017 |

OTHER PUBLICATIONS

KR20170097828 English Translation, downloaded from Espacenet (Year: 2017).*
Jun-Ho Kang et al., "Unconventional Hall effect in metal/semiconductor hybrid spintronic devices," Applied Physics Letters, vol. 119, p. 112401, Sep. 13, 2021, doi: 10.1063/5.0064895.
Sileo, L., et al. "Fully Integrated Three-Axis Hall Magnetic Sensor Based on Micromachined Structures." Microelectronic Engineering, vol. 87, pp. 1217-1219, Dec. 3, 2009, doi:10.1016/j.mee.2009.11.160.
Ch. Schott et al., "Single-chip 3-D silicon Hall sensor", Sensors and Actuators, vol. 82, pp. 167-173, 2000.
Brian T. Schaefer et al., "Gate-Tunable Graphene Hall Sensors with High Magnetic Field Sensitivity Brian", arXiv:1912.12678v1 [cond-mat.mes-hall] Dec. 29, 2019.

* cited by examiner

*Primary Examiner* — Minh Q Phan
(74) *Attorney, Agent, or Firm* — LEX IP MEISTER, PLLC

(57) ABSTRACT

A magnetic sensor includes a silicon substrate, a cross-shaped metal pattern formed on the silicon substrate and directly contacting the silicon substrate, and an insulating layer covering the cross-shaped metal pattern.

7 Claims, 13 Drawing Sheets

MAGNETIC SENSOR USING METAL AND SILICON JUNCTION STRUCTURE

CROSS-REFERENCE TO RELATED APPLICATION

This application claims priority to and the benefit of Korean Patent Application No. 10-2022-0002748 filed in the Korean Intellectual Property Office on Jan. 7, 2022, and Korean Patent Application No. filed in the Korean Intellectual Property Office on, the entire contents of which are incorporated herein by reference.

BACKGROUND

(a) Field

The present disclosure relates to a magnetic sensor capable of measuring a magnitude of each direction component of a magnetic field.

(b) Description of the Related Art

In recent years, automation has been progressed throughout each industry, and development of an integrated control system through a network has been actively progressed. For example, an Internet of things (IoT) system that connects and controls each object in a home through a network has been developed and adopted, and in various industrial fields, robot devices are installed to perform tasks in place of humans, and human robotics technology of developing automated robots that help humans has been actively researched, and in the field of automobiles, technology in which machines and artificial intelligence, such as autonomous driving, automatically perform tasks on behalf of humans has been developed. Various sensors are employed in such automation and integrated control systems, and among them, a sensor for detecting a magnetic field takes an important position.

According to a report released by Grand View Research (GVR) in 2019, a market size of magnetic sensors in 2018 was $2 billion and is expected to grow at an average annual rate of 6.8%. As the IoT industry, such as smartphones and smart home appliances, has been developed rapidly, the need for magnetic sensors that measure magnetic field information in an adjacent environment has increased. In particular, as artificial intelligence (AI) technology penetrates through industries, such as smart factories, robotics, and autonomous driving, the need for high-performance sensors that provide basic data for determining a real-time value of AI has also come into prominence. Due to this need, studies on the implementation of a high-efficiency magnetic sensor have been conducted in various ways.

The market of Hall effect-based magnetic sensors is the largest at nearly half of the entire magnetic sensor market, and magnetic material-based devices, such as anisotropic magnetoresistance (AMR), giant magnetoresistance (GMR), and tunnel-magnetoresistance (TMR), are included therein. In a conventional Hall effect magnetic sensor, not only the Hall effect due to a magnetic field component perpendicular to a device surface, but also a planar hall effect (PHE) due to a planar magnetic field component occur together, so that it was difficult to accurately measure a magnetic field component in a specific direction with a single device. Therefore, a procedure of canceling the PHE using two or more devices was essential, and it was also difficult to avoid increasing the size of the sensor and additional data processing.

SUMMARY

The embodiments have been made in an effort to provide an efficient magnetic sensor having advantages of accurately measuring magnetic field components in each three-dimensional direction.

The embodiments have also been made in an effort to provide an magnetic sensor that is advantageous for device miniaturization with a simple structure.

An embodiment provides a magnetic sensor including: a silicon substrate; a cross-shaped metal pattern formed on the silicon substrate and directly contacting the silicon substrate; and an insulating layer covering the cross-shaped metal pattern.

The magnetic sensor may further include an X-shaped silicon pattern formed on the insulating layer. The silicon pattern may be doped with P-type or N-type impurities. Four branches of the X-shaped silicon pattern may be arranged to form 45 degrees with four branches of the cross-shaped metal pattern.

The silicon substrate may be an intrinsic silicon substrate, and the silicon substrate may be doped with P-type due to impurities inevitably included in a manufacturing process.

The cross-shaped metal pattern may be a single layer entirely formed of the same material, and the cross-shaped metal pattern may include at least one of Ta, Al, Ti, Zn, W, Mo, Cu, Ni, Au, and Pt.

The magnetic sensor to which the metal and silicon junction structure is applied according to an embodiment may accurately measure the size of each 3-dimensional component of a magnetic field with only a single device and has a simple structure to facilitate miniaturization of the device.

DETAILED DESCRIPTION OF THE EMBODIMENTS

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Figure 1:
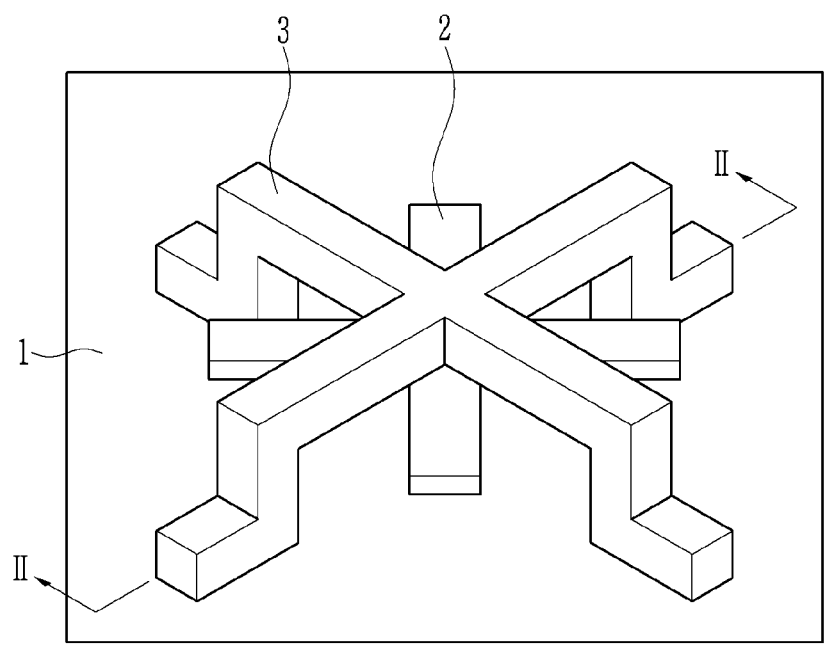
FIG. 1 is a perspective view of a magnetic sensor according to an embodiment to which a metal and silicon junction structure is applied.
Figure 2:
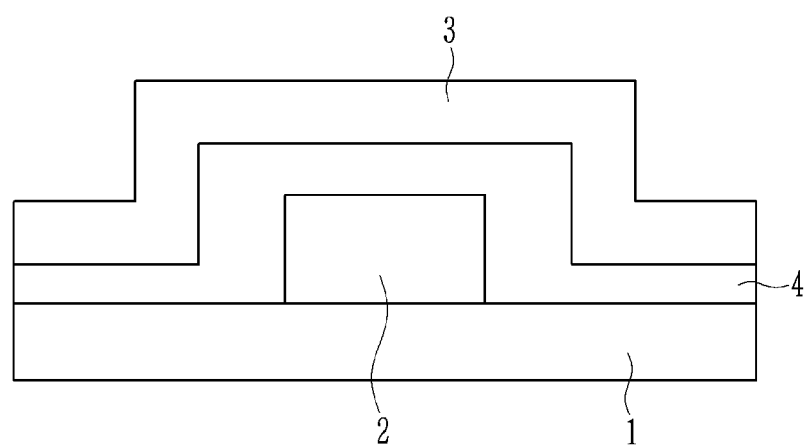
FIG. 2 is a cross-sectional view taken along line II-II of FIG. 1.

FIG. 1 is a perspective view of a magnetic sensor according to an embodiment to which a metal and silicon junction structure is applied, and FIG. 2 is a cross-sectional view taken along line II-II of FIG. 1.

A magnetic sensor according to an embodiment, to which a metal and silicon junction structure is applied, includes a silicon substrate 1, a cross (+) shaped metal pattern 2 formed on the silicon substrate 1, an insulating layer 4 covering the metal pattern 2, and an X-shaped low-resistance silicon pattern 3 formed on the insulating layer 4.

As the silicon substrate 1, intrinsic silicon exhibiting resistance characteristics in the range of $10^4$ Ωcm is applied. The silicon substrate 1 are not doped with impurities in a separate process, but may be lightly doped with P-type impurities that are inevitably included in a manufacturing process of the silicon substrate 1.

The cross-shaped metal pattern 2 may include a single metal, such as tantalum (Ta), aluminum (Al), titanium (Ti), zinc (Zn), tungsten (W), molybdenum (Mo), copper (Cu), nickel (Ni), gold (Au), or platinum (Pt), or alloys thereof, and may be formed through sputtering deposition, photolithography, and dry etching processes. A line width of the cross-shaped metal pattern 2 may be formed between 1 μm and 100 μm, and a length thereof may be formed to be about 5 times the line width. A thickness of the cross-shaped metal pattern 2 ranges from 5 nm to 50 nm.

The insulating layer 4 may be an oxide film, such as silicon oxide, or a nitride film, such as silicon nitride, and is configured to insulate the cross-shaped metal pattern 2 from the low-resistance silicon pattern 3. Therefore, the insulating layer 4 does not need to cover the entire cross-shaped metal pattern 2, and may be disposed only in a portion where the cross-shaped metal pattern 2 and the low-resistance silicon pattern 3 overlap each other. The insulating layer 4 may be formed using a film deposition method, such as chemical vapor deposition (CVD) or physical vapor deposition (PVD), photolithography, and an etching method.

The X-shaped low-resistance silicon pattern 3 is formed of silicon doped with a P-type impurity or an N-type impurity and has a resistance in the range of 1 to 10 Ωcm. In the present embodiment, the X-shaped low-resistance silicon pattern 3 is arranged to cross the cross-shaped metal pattern 2 diagonally (45 degrees), and this arrangement advantageously secure a space for forming an electrode connection structure for measuring a magnetic field. However, the angle at which the X-shaped low-resistance silicon pattern 3 crosses the cross-shaped metal pattern 2 may be variously modified as needed. The X-shaped low-resistance silicon pattern 3 may be formed using film deposition, such as chemical vapor deposition (CVD) or physical vapor deposition (PVD), impurity doping, photolithography and etching.

Although not shown, a protective layer may be formed on the X-shaped low-resistance silicon pattern 3 to protect the X-shaped low-resistance silicon pattern 3.

The magnetic sensor according to an embodiment uses a silicon material, unlike existing magnetic substrate elements, and thus has high process compatibility with the elements based on complementary metal-oxide-semiconductor (CMOS). In addition, since the magnetic sensor according to an embodiment has a simple structure in which all elements capable of measuring three-dimensional components of a magnetic field are vertically integrated, the magnetic sensor is advantageous for device miniaturization.

Figure 3:
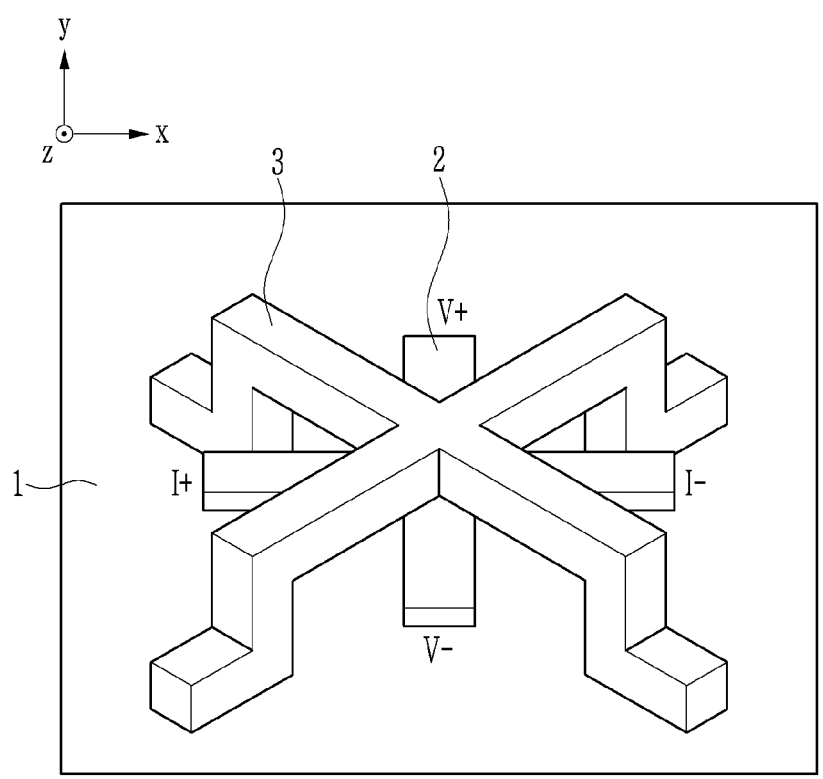
FIGS. 3, 4, and 5 are perspective views illustrating methods of measuring magnetic fields in an x-axis direction, a y-axis direction, and a z-axis direction using a magnetic sensor according to an embodiment, respectively.
Figure 4:
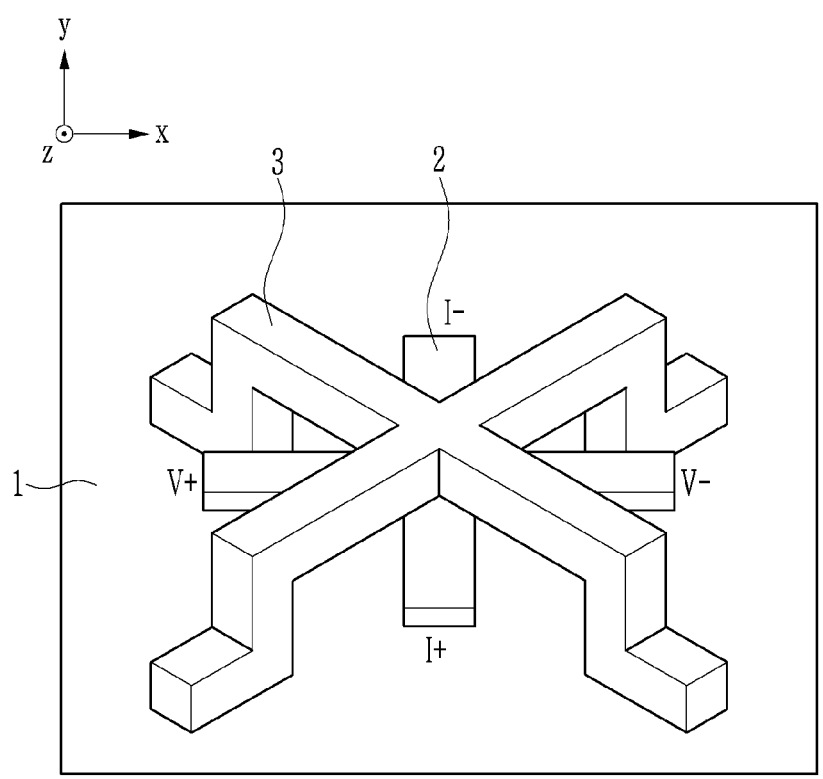
Figure 5:
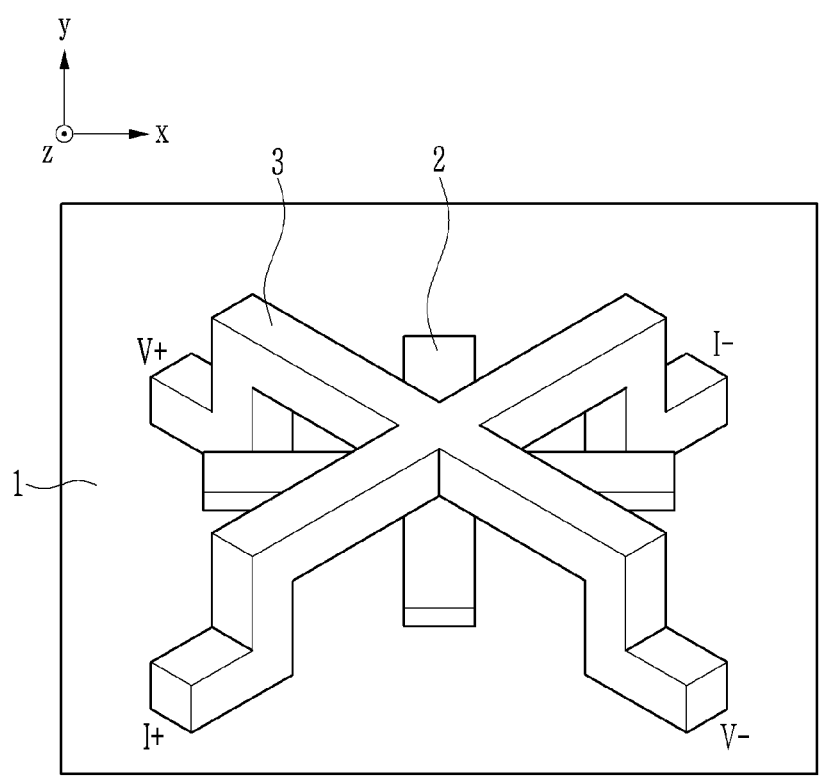

FIGS. 3, 4, and 5 are perspective views illustrating methods of measuring magnetic fields in an x-axis direction, a y-axis direction, and a z-axis direction using the magnetic sensor according to an embodiment, respectively.

Firstly, referring to FIG. 3, assuming that the cross-shaped metal pattern 2 is placed to coincide with the xy coordinate axis, in order to measure a magnetic field component in the x-axis direction, a current flows through both ends of the x-axis direction branches of the cross-shaped metal pattern 2 (that is, a current flows in the x-axis direction), and a Hall voltage is measured through both ends of the branches in the y-axis direction. This measurement method is completely different from the existing method of measuring a magnetic field component in the z-axis direction by allowing a current to flow in the x-axis direction and measuring a Hall voltage in the y-axis direction, and the measurement principle will be described later.

Next, referring to FIG. 4, assuming that the cross-shaped metal pattern 2 is placed in line with the xy coordinate axis, in order to measure a magnetic field component in the y-axis direction, a current is allowed to flow through both ends of the branch of the cross-shaped metal pattern 2 in the y-axis direction (that is, a current flows in the y-axis direction), and a Hall voltage is measured through both ends of the branch in the x-axis direction.

Referring to FIG. 5, in order to measure a z-direction magnetic field component, current is allowed to flow through both ends of a branch of the X-shaped low-resistance silicon pattern 3 in one axis direction, and a Hall voltage is measured through both ends of a branch in another axis direction. This method of measuring the magnetic field component in the z-axis direction uses an existing measurement method.

In this manner, the magnetic field components in the x, y, and z-axis directions may be independently measured, so that each of the magnetic field components in the x, y, and z-axis directions may be measured without a complicated data processing process.

Figure 6:
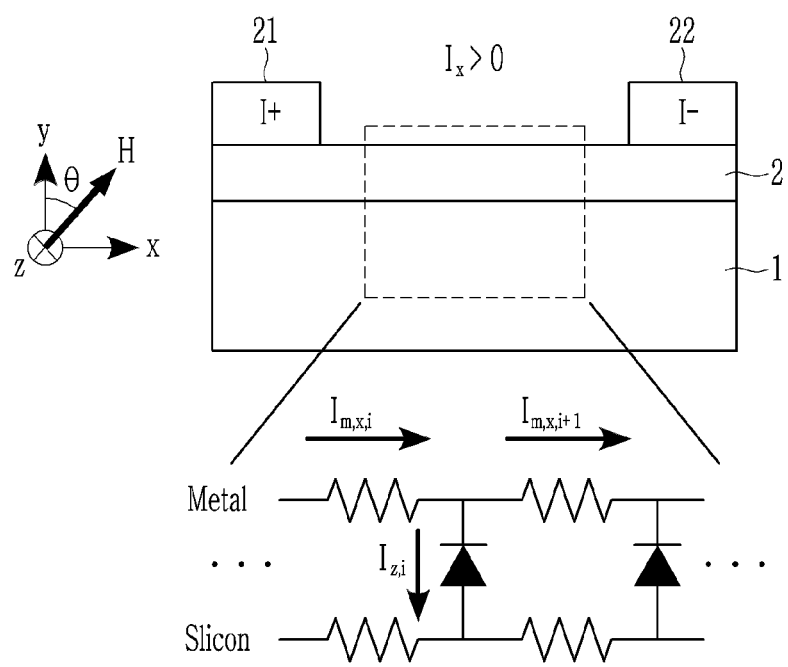
FIG. 6 is a view illustrating a measurement principle of a magnetic sensor to which a metal and silicon junction structure is applied according to an embodiment.

FIG. 6 is a view illustrating a measurement principle of a magnetic sensor according to an embodiment to which a metal and silicon junction structure is applied.

A magnetic sensor according to an embodiment, to which a metal and silicon junction structure is applied, measures the x-axis and y-axis directional magnetic field components using a z-axis directional current Iz generated by a Schottky barrier formed between the metal and silicon More specifically, the Schottky barrier induces electrical directionality between the metal and silicon by differentiating a current response according to voltage application in the metal direction and a current response according to voltage application in the silicon direction. Therefore, in the silicon substrate 1 of FIG. 6, depletion layers are formed to be different in the vicinity of a positive (+) electrode and a negative (−) electrode, and as a result, resistances of a left region and a right region of the silicon substrate 1 are different. The difference in resistance causes the current Iz to flow in the z-direction, and when a magnetic field is applied in the x-direction, a Hall voltage due to the current Iz is formed in the y-axis direction, so that magnetic field information may be detected. Therefore, when a current is applied in the x-direction, the magnetic field component in the x-direction is measured using the Hall voltage by the current Iz. When a current is applied in the y-direction and the Hall voltage is measured, a magnetic field in the y-direction is detected. By measuring the magnetic field components in two directions perpendicular to each other, both direction information and magnitude information of the magnetic field acting on the plane of the device may be measured.

Figure 7:
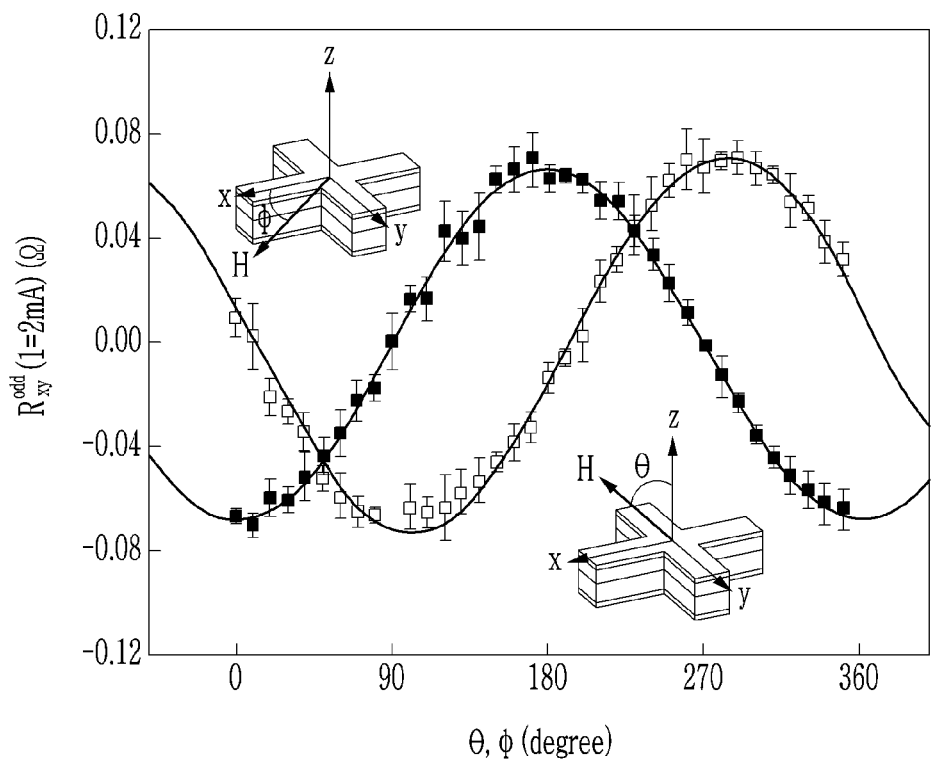
FIG. 7 is a graph illustrating orthogonality of a value measured by a magnetic sensor according to an embodiment with respect to components of a magnetic field.
Figure 8:
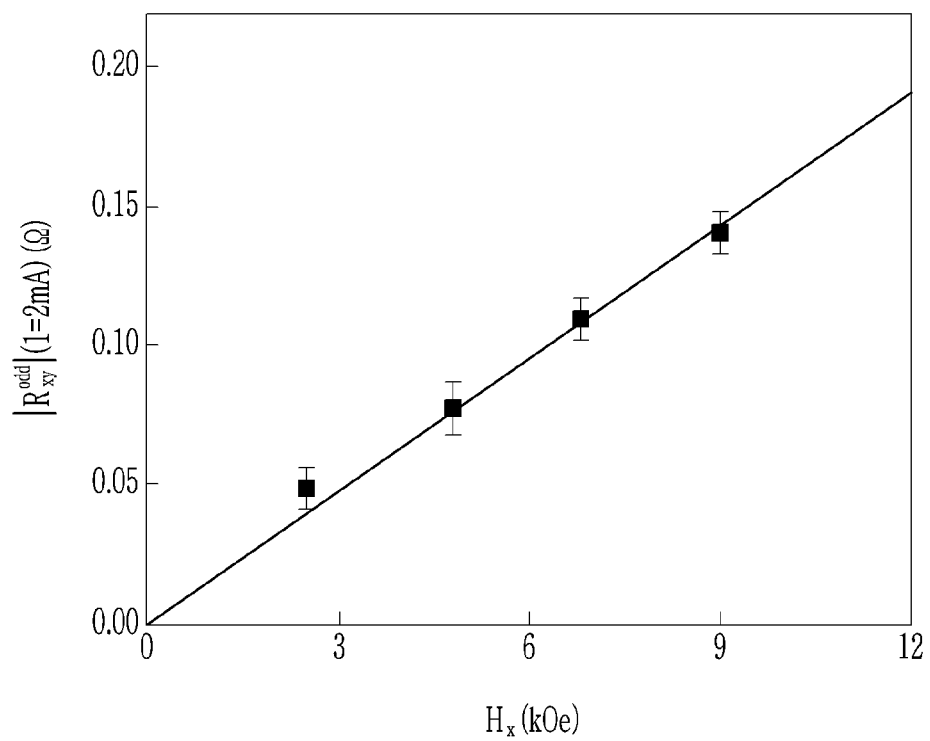
FIG. 8 is a graph illustrating linearity of a value measured by a magnetic sensor according to an embodiment with respect to a magnitude of a magnetic field.

FIG. 7 is a graph illustrating orthogonality of a value measured by a magnetic sensor according to an embodiment, to which a metal and silicon junction structure is applied, with respect to components of a magnetic field, and FIG. 8 is a graph illustrating linearity of a value measured by a magnetic sensor to which a metal and silicon junction structure is applied according to an embodiment with respect to a magnitude of a magnetic field.

Linearity and orthogonality with respect to a magnetic field are key performance evaluation factors of a magnetic sensor. Linearity is a characteristic of how linear a characteristic resistance of a device is according to a change in a magnitude of a magnetic field, and orthogonality is a characteristic how uniquely the characteristic resistance of a device is dependent only on a magnetic field in a specific direction. The above characteristics are important because they reduce the complexity of a process of converting a magnitude and direction of an applied external magnetic field.

Referring to FIG. 7, a value measured by the magnetic sensor according to an embodiment using the measurement method of FIG. 3 represents a sine wave in which θ is 0 at 0 degrees, is maximum at 90 degrees, and is 0 again at 180 degrees, and φ is maximum at 0 degrees, 0 at 90 degrees, and is maximum again at 180 degrees. This shows that the value measured by the magnetic sensor according to an embodiment using the measurement method of FIG. 3 is dependent only on the component in the x-axis direction, indicating that the orthogonality with respect to the magnetic field is excellent.

Referring to FIG. 8, it can be seen that the measured value of the magnetic sensor according to an embodiment is directly proportional to a magnitude Hx of the magnetic field. That is, the linearity with respect to the magnetic field is excellent.

Figure 9:
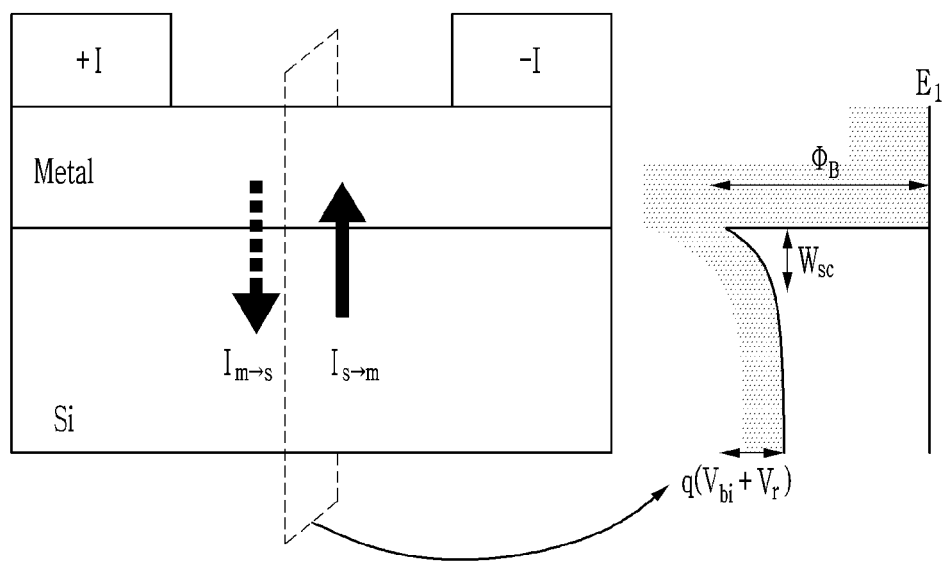
FIG. 9 is a view illustrating a role of a Schottky barrier in relation to a measurement principle of a magnetic sensor according to an embodiment.

FIG. 9 is a view illustrating a role of a Schottky barrier in relation to a measurement principle of a magnetic sensor according to an embodiment to which a metal and silicon junction structure is applied.

As described above, the origin of the measurement signal is a current Is-m flowing over a Schottky barrier formed between the metal layer and the silicon layer, as shown in FIG. 9. Therefore, as the Schottky barrier is lower, more current flows and the measurement signal increases. Although the silicon substrate 1 is undoped intrinsic silicon, the silicon substrate 1 is very lightly doped to P-type due to impurities inevitably included in the manufacturing process. In this case, the Schottky barrier is defined as, $$\phi_{Bp} = \frac{E_g}{q} + \chi - \phi_m,$$

Here, $\phi_m$ represents the work function of the metal, and as the work function $\phi_m$ increases, $\phi_{Bp}$ may decrease so that more current flows and the measurement signal may increase.

Figure 10:
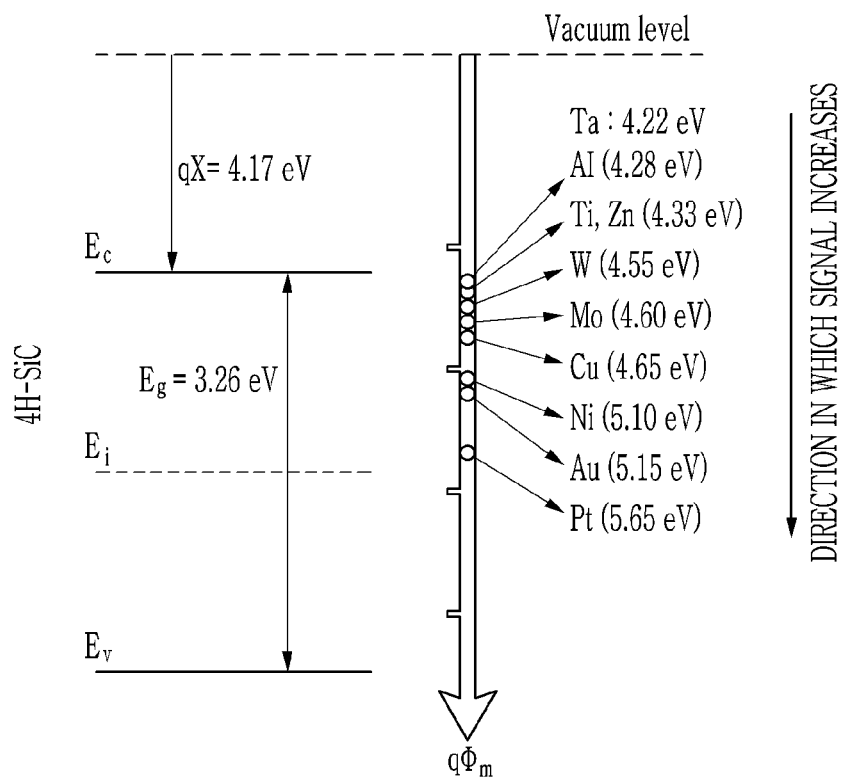
FIG. 10 is a view illustrating a work function distribution of various metals applicable to a magnetic sensor according to an embodiment.

FIG. 10 is view illustrating a work function distribution of various metals applicable to a magnetic sensor to which a metal and silicon junction structure is applied according to an embodiment.

There is no particular limitation on the metal that may be used in the cross-shaped metal pattern 2 of the magnetic sensor according to an embodiment, to which the metal and silicon junction structure is applied, and a metal having an appropriate work function may be used according to the requirements of a device. The metals shown in FIG. 10 are examples of metals applicable to a magnetic sensor according to an embodiment, to which a metal and silicon junction structure is applied, and their work functions are large in the order of thallium (Ta), aluminum (Al), and titanium (Ti), zinc (Zn), tungsten (W), molybdenum (Mo), copper (Cu), nickel (Ni), gold (Au), and platinum (Pt), so the magnitude of the measurement signal also increases accordingly.

Figure 11:
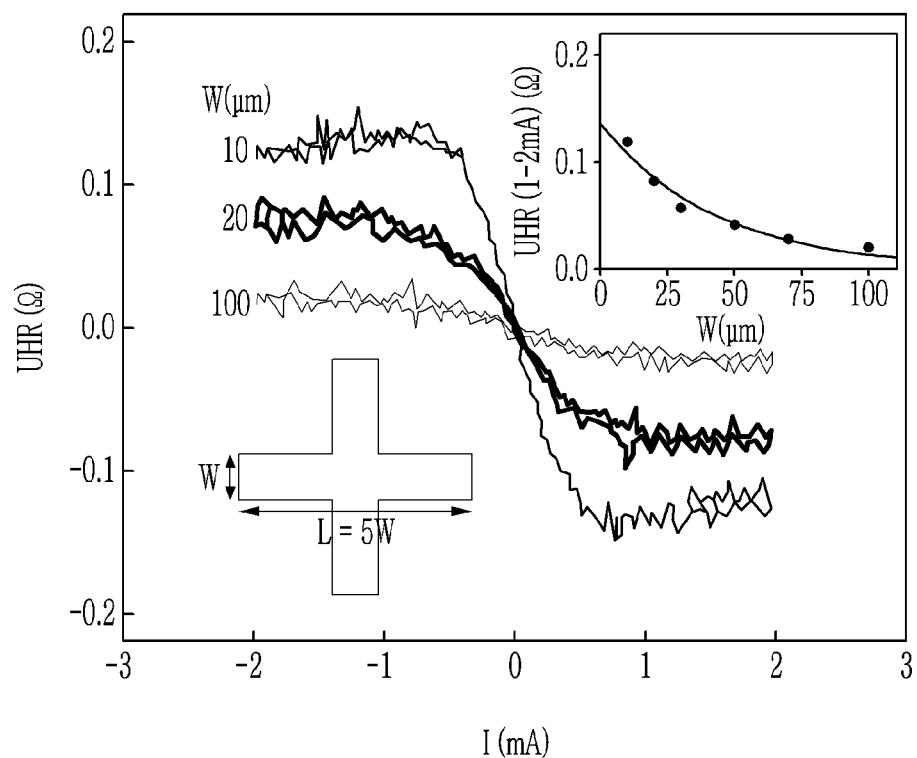
FIG. 11 is a graph illustrating a magnitude of a measurement signal according to a size of a metal pattern of a magnetic sensor according to an embodiment.

FIG. 11 is a graph illustrating a magnitude of a measurement signal according to a size of a metal pattern of a magnetic sensor according to an embodiment to which a metal and silicon junction structure is applied.

Referring to FIG. 11, it can be seen that the magnitude of the measurement signal gradually increases as the line width w of the metal pattern increases to 100 μm, 20 μm, and 10 μm. That is, as the size of the sensor decreases, the magnitude of the measurement signal increases. In this manner, as the sensor size is miniaturized, a larger measurement signal may be obtained, which is advantageous for miniaturizing the sensor size.

Figure 12:
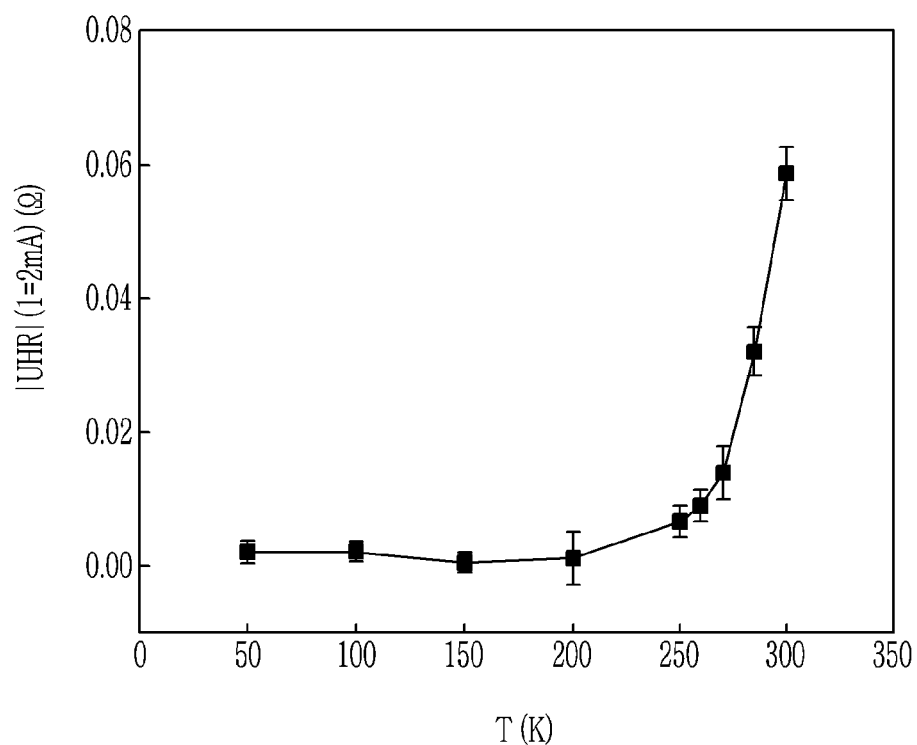
FIG. 12 is a graph illustrating a magnitude of a measurement signal according to temperature of a magnetic sensor according to an embodiment.

FIG. 12 is a graph illustrating a magnitude of a measurement signal according to temperature of a magnetic sensor according to an embodiment to which a metal and silicon junction structure is applied.

Referring to FIG. 12, it can be seen that, in the magnetic sensor according to an embodiment, as the temperature increases, the magnitude of the measurement signal increases. Therefore, the magnetic sensor according to an embodiment may be used for devices that should operate at high temperatures, such as high-temperature motors.

Figure 13:
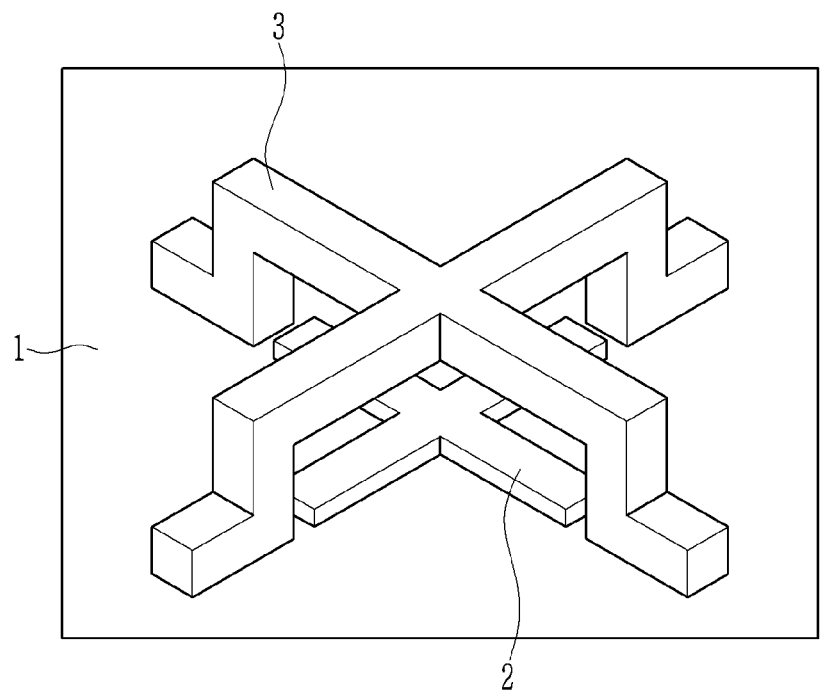
FIG. 13 is a perspective view of a magnetic sensor according to another embodiment to which a metal and silicon junction structure is applied.

FIG. 13 is a perspective view of a magnetic sensor according to another embodiment to which a metal and silicon junction structure is applied.

In the embodiment of FIG. 13, unlike the embodiment of FIG. 1, the X-shaped low-resistance silicon pattern 3 is disposed to overlap the cross-shaped metal pattern 2. This arrangement is only one of various modified examples, and various other arrangements may also be provided. For example, it is also possible to separately arrange the cross-shaped metal pattern 2 and the X-shaped low-resistance silicon pattern at different positions on a plane.

While the present invention has been described in connection with embodiments, it is to be understood that the invention is not limited to the disclosed embodiments, but, on the contrary, is intended to cover various modifications and equivalent arrangements included within the spirit and scope of the appended claims.

What is claimed is:

1. A magnetic sensor comprising:
   a silicon substrate;
   a cross-shaped metal pattern formed on the silicon substrate and directly contacting the silicon substrate;
   an insulating layer covering the cross-shaped metal pattern; and
   an X-shaped silicon pattern formed on the insulating layer
   wherein the cross-shaped metal pattern is fully metallic.

2. The magnetic sensor of claim 1, wherein:
   the silicon pattern is doped with P-type or N-type impurities.

3. The magnetic sensor of claim 2, wherein:
   four branches of the X-shaped silicon pattern are arranged to form 45 degrees with four branches of the cross-shaped metal pattern.

4. The magnetic sensor of claim 1, wherein:
   the silicon substrate is an intrinsic silicon substrate.

5. The magnetic sensor of claim 4, wherein:
   the silicon substrate is doped with P-type due to impurities inevitably included in a manufacturing process.

6. The magnetic sensor of claim 1, wherein:
   the cross-shaped metal pattern is a single layer entirely formed of the same material.

7. The magnetic sensor of claim 6, wherein:
   the cross-shaped metal pattern includes at least one of Ta, Al, Ti, Zn, W, Mo, Cu, Ni, Au, and Pt.

* * * * *